United States Patent
Hsu et al.

(10) Patent No.: US 10,269,530 B1
(45) Date of Patent: Apr. 23, 2019

(54) ION BEAM SOURCE FOR SEMICONDUCTOR ION IMPLANTATION

(71) Applicant: Taiwan Semiconductor Manufacturing Co., Ltd., Hsin-Chu (TW)

(72) Inventors: Hsing-Piao Hsu, Hsin-Chu (TW); Nai-Han Cheng, Zhudong Township (TW); Shih-Fang Chen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/885,286

(22) Filed: Jan. 31, 2018

Related U.S. Application Data

(60) Provisional application No. 62/592,108, filed on Nov. 29, 2017.

(51) Int. Cl.
*H01J 37/08* (2006.01)
*H01L 21/26* (2006.01)
(Continued)

(52) U.S. Cl.
CPC ............ *H01J 37/08* (2013.01); *H01J 37/3171* (2013.01); *H01J 2237/06308* (2013.01); *H01J 2237/082* (2013.01); *H01L 21/265* (2013.01)

(58) Field of Classification Search
CPC .... H01J 2237/3175; H01J 17/04; H01J 17/06; H01J 1/025; H01J 1/20; H01J 1/28; H01J 1/304; H01J 2201/2867; H01J 2237/061; H01J 2237/065; H01J 2237/31754; H01J 2237/31774; H01J 2237/3365; H01J 27/02; H01J 27/08; H01J 31/08; H01J 35/065; H01J 37/08; H01J 37/3177; H01J 37/32055; H01J 37/3233; H01J 37/32357; H01J 37/32422; H01J 37/3244; H01J 37/32458; H01J 37/32541; H01J 37/3255; H01J 37/32669; H01J 3/021; H01J 3/025; H01J 3/04; H01J 43/02; H01J 61/067; H01J 61/09; H01J 61/12; H01J 61/305; H01J 61/66; H01J 61/68; H01J 61/72; H01J 61/78; H01J 9/025; H01J 9/042; H01J 35/10; H01J 35/14; H01J 37/06; H01J 37/065; B82Y 10/00; B82Y 40/00
(Continued)

(56) References Cited

U.S. PATENT DOCUMENTS 2,756,360 A * 7/1956 O'Neill ................... H01J 43/02
313/103 R
4,549,082 A * 10/1985 McMillan ................. G21K 1/14
250/423 R
(Continued)

*Primary Examiner* — David A Vanore
(74) *Attorney, Agent, or Firm* — Duane Morris LLP

(57) ABSTRACT

An apparatus includes an ionization chamber and an electron source device at least partially disposed inside the ionization chamber. The ionization chamber is configured to receive at least one chemical and provide plasma having ionized chemicals. The electron source device includes at least one filament configured to generate electrons, and a cathode configured to emit secondary electrons from the front surface when the electrons from the at least one filament hit the back surface of the cathode. The front surface of the cathode is shaped convex facing inside the ionization chamber.

20 Claims, 12 Drawing Sheets

(51) Int. Cl.
*H01L 21/265* (2006.01)
*H01J 37/317* (2006.01)

(58) Field of Classification Search
USPC .......... 250/423 R, 493.1, 396 R, 423 F, 427,
250/492.1, 492.3; 313/337, 346 R, 103 R,
313/237, 240, 423, 250, 265, 270, 297,
313/310, 345, 346 DC, 491, 574, 576,
313/613, 614, 632
See application file for complete search history.

(56) References Cited

U.S. PATENT DOCUMENTS

| | | | | |
|---|---|---|---|---|
| 5,686,789 | A * | 11/1997 | Schoenbach | H01J 1/025 |
| | | | | 313/491 |
| 6,091,187 | A * | 7/2000 | Golladay | H01J 1/20 |
| | | | | 313/237 |
| 6,300,636 | B1 | 10/2001 | Shih et al. | |
| 6,541,785 | B1 * | 4/2003 | Nakasuji | H01J 37/06 |
| | | | | 250/396 R |
| 7,781,975 | B2 * | 8/2010 | Ueno | H01J 61/68 |
| | | | | 313/243 |
| 8,263,942 | B2 * | 9/2012 | Steenbrink | H01J 1/28 |
| | | | | 250/423 F |
| 9,960,003 | B2 * | 5/2018 | Geisler | H01J 35/065 |
| 2016/0351379 | A1 * | 12/2016 | Sato | H01J 37/32669 |

* cited by examiner

ION BEAM SOURCE FOR SEMICONDUCTOR ION IMPLANTATION

PRIORITY CLAIM AND CROSS-REFERENCE

This application claims the benefit of U.S. Provisional Application No. 62/592,108, filed Nov. 29, 2017, which application is expressly incorporated by reference herein in its entirety.

BACKGROUND

This disclosure relates to semiconductor processing. More particularly, the disclosed subject matter relates to an ion beam source for use in ion implantation equipment for semiconductor processing.

Ion implantation is commonly used for doping a semiconductor material at precisely controlled depths and dopant concentrations. An ion implanter generally includes an ion source to generate an ion beam, ion beam transport optics for accelerating the ion beam, and a process chamber where the ion implantation on a semiconductor wafer occurs. The ions are mostly positively charged. During ion implantation, the charged ion beam strikes the semiconductor wafers in the process chamber, resulting in a doped semiconductor wafer when the dopant ions diffuse into the wafer.

Meanwhile, the size of semiconductor wafers has gradually increased to improve throughput and reduce cost per die. For example, in the transition from 300 mm to 450 mm wafer size, the wafer area increases by 125%. The within wafer uniformity (WiWU) becomes more difficult to maintain in the more-than-double-sized wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION

Figure 1:
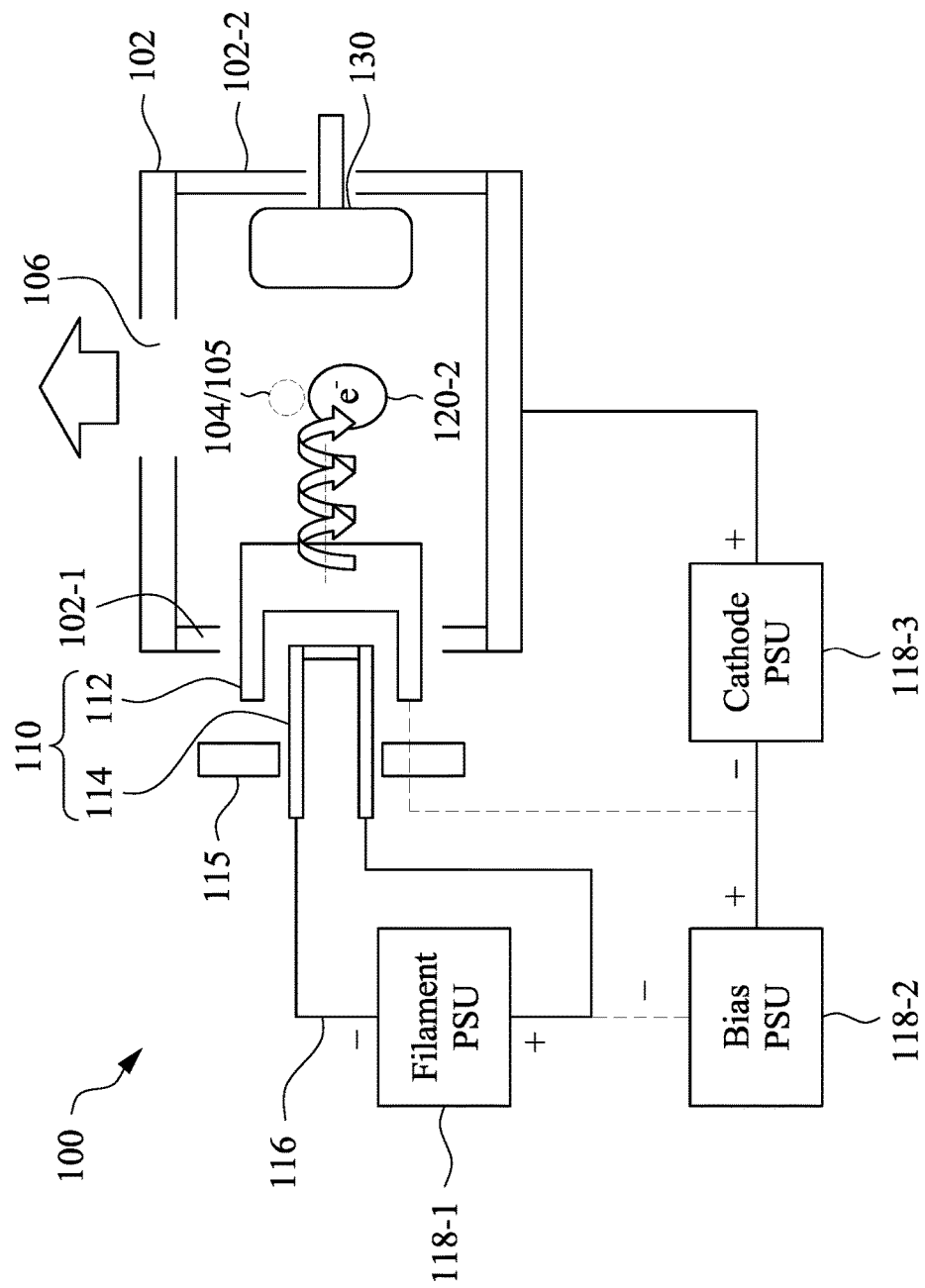
FIG. 1 is a cross-sectional view of an exemplary apparatus of ion beam source comprising a cathode having a flat surface in some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

An ion beam containing dopants is generated in an ion beam source chamber. Thermionic electrons are first generated from a metal such as tungsten filament, which is heated by a current source. The filament is also negative biased. Thermionic electrons can be accelerated by the biased potential, and collide with molecules of dopant precursors to generate plasma comprising dopant ions. Such plasma comprising dopant ions can be used for a semiconductor processing such as ion implantation.

The present disclosure provides an apparatus of ion source for ion implantation, and a method of making such an apparatus for generating ions used in a process of ion implantation.

For brevity and clarification, references to "secondary electrons" made below will be understood to encompass the electrons emitted from a cathode after the electrons emitted from filaments are directed toward the cathode. References to electrons for ionizing dopant gas made below will be understood to encompass the electrons mainly from the cathode, unless expressly indicated otherwise.

In FIGS. 1-5, like items are indicated by like reference numerals, and for brevity, descriptions of the structure, provided above with reference to the preceding figures, are not repeated. The method described in FIG. 6 is described with reference to the exemplary structure described in FIGS. 1-5.

Referring to FIGS. 1 and 2A-2D, an apparatus 100 is provided and used in some embodiments. Apparatus 100 comprises an ionization chamber 102 and an electron source device 110. The electron source device 110 is at least partially disposed inside the ionization chamber 102. The ionization chamber 102 is configured to receive at least one chemical such as a dopant gas and provide plasma comprising ionized chemicals. In some embodiments, the ionization chamber 102 includes at least one inlet 104 for receiving the at least one chemical 105 such as a dopant gas. The ionization chamber also defines an aperture 106 providing an exit pathway for the plasma comprising ionized chemicals.

The at least one inlet 104 may be disposed on or through a sidewall of the ionization chamber 102, and is used to supply at least one chemical such as a dopant gas into ionization chamber 102. The at least one inlet 104 may include one or more inlets depending on the types of the chemicals used. Examples of dopants include but are not limited to $BF_3$, $PH_3$, $AsH_3$ and any other dopant precursors suitable for doping a semiconductor wafer. The starting material for dopant gas is in the form of gas, liquid or solid. In some embodiments, solid dopants are vaporized at a raised temperature such as 200° C. or higher, or decomposed at an elevated temperature such as 800° C. or higher. A dopant may be introduced with a carrier or reactive gas. Examples of such a carrier or reactive include, but are not limited to, nitrogen, argon, oxygen and hydrogen.

The electron source device 110 comprises a cathode 112, and one filament 114 configured to generate electrons 120-1 under heating or an electric field. The filament 114 may be heated upon a voltage applied thereon. The cathode 112 has a front surface 112-1 and a back surface 112-2, and is configured to emit secondary electrons 120-2 from the front surface 112-1 when the electrons 120-1 from the at least one filament 114 hits the back surface 112-2 of the cathode 112. The cathode 112 is configured so that the secondary electrons 120-2 collide with the at least one chemical 105 so as to generate the plasma comprising ions of the at least one chemical.

Figure 2A:
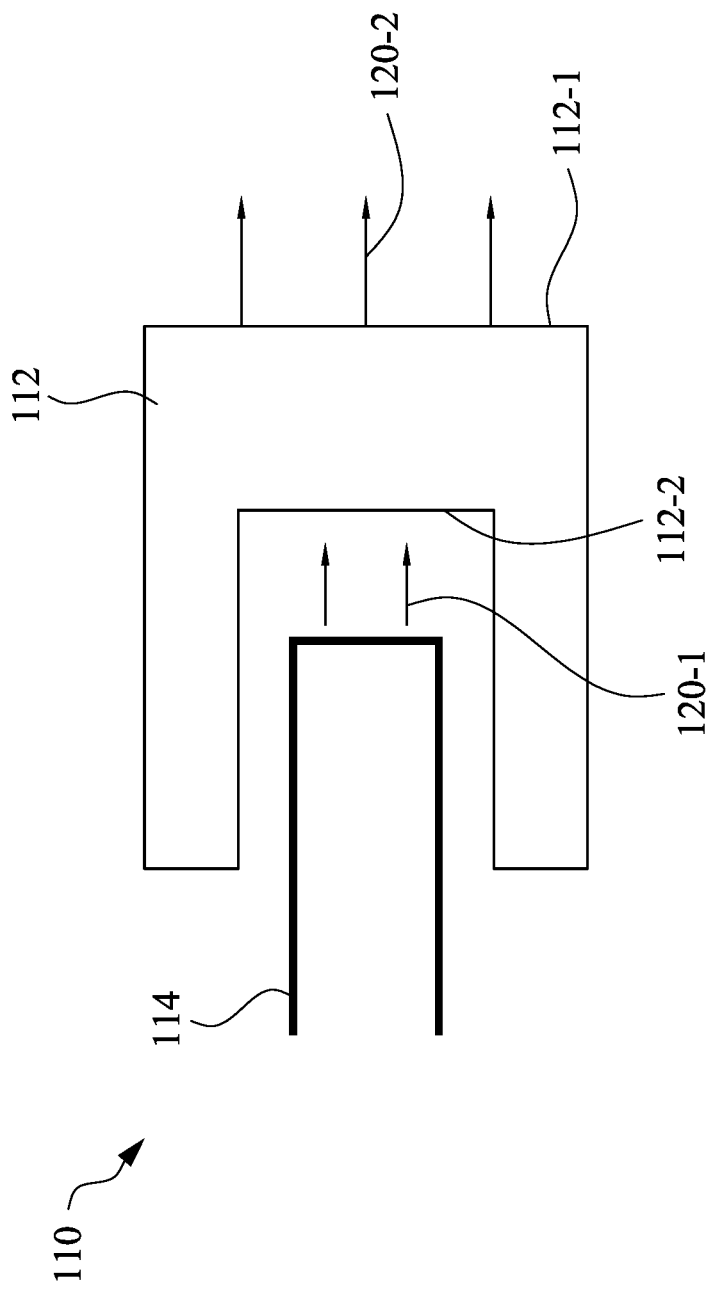
FIG. 2A is an enlarged view illustrating a filament and a cathode of the exemplary apparatus of FIG. 1.
Figure 2B:
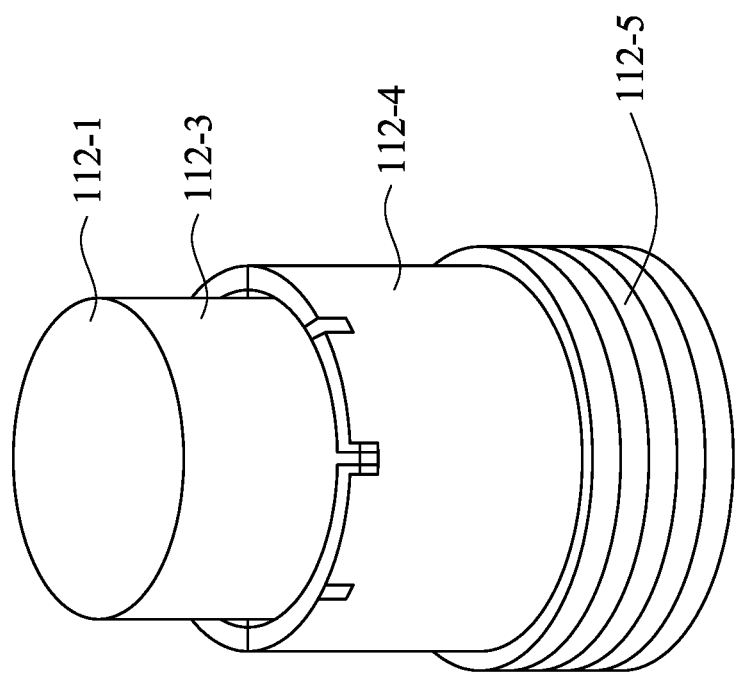
FIG. 2B is a perspective view illustrating the cathode of the exemplary apparatus of FIG. 1.
Figure 2D:
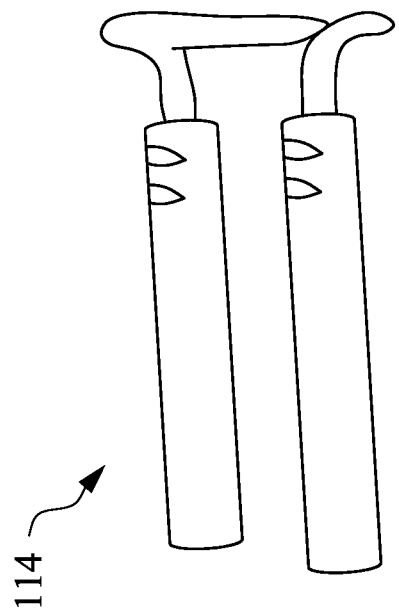
FIG. 2C and FIG. 2D are perspective views illustrating the filament of the exemplary apparatus of FIG. 1.
Figure 2C:
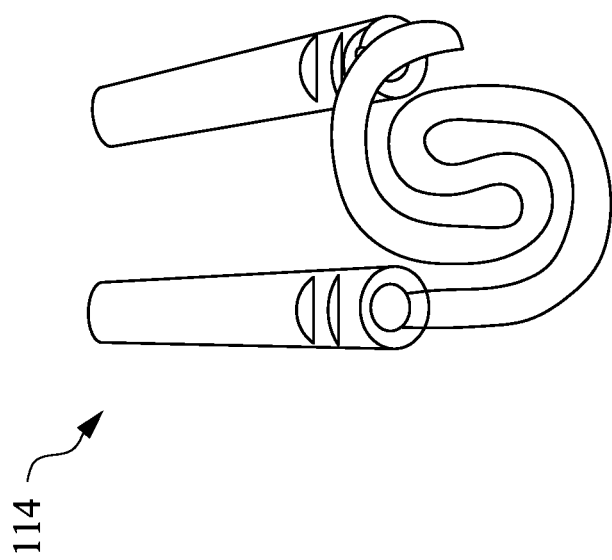

As illustrated in FIG. 1 and FIG. 2A, the cathode 112 has a flat front surface 112-1 in some embodiments. Referring to FIG. 2B, an exemplary cathode 112 may be in a shape of hallow cylinder, inside which the at least one filament 114 is disposed. Such an exemplary cathode 112 may include one piece or two pieces, for example, a top piece 112-3 and a bottom piece 112-4. The bottom piece 112-4 may include thread 112-5. Through the thread 112-5, the cathode 112 may be coupled or fixed onto a sidewall of the ionization chamber 102 or a fixture adjacent to the ionization chamber 102 (FIG. 1). Referring to FIGS. 2C and 2D, the filament 114 may be twisted, and has a top portion with a tortuous path aligned in one plane parallel to the front surface 112-1 or the back surface 112-2 of the cathode 112. The filament 114 may be coupled with the ionization chamber 102 through a fixture 115. Both the cathode 112 and the filaments may be made of a refractory metal such as tungsten.

Referring to FIG. 1, the cathode 112, the filament 114, and the ionization chamber 102 may be connected with one or more power supply units, for example, three power supply units 118-1, 118-2, and 118-3, though conductive wires 116. Power supply unit 118-1 applies a voltage to excite and heat the filament 114 so that the filament 114 emits electrons 120-1. Power supply unit 118-3 applies a voltage to the cathode 112 so that the cathode 112 emits secondary electrons 120-2 from the front surface 112-1 when the electrons 120-1 hits the back surface 112-2 of the cathode 112. In some embodiments, cathode 112 is biased at a voltage from a DC supplier 118-2. The biased voltage is in the range of 1000-3000 volts. For example, the voltage is 2000 volt in some embodiments.

The electronic source device 110 may be installed in a first wall 102-1 of the ionization chamber 102. A repeller 130 may be disposed on a second wall 102-2 opposite to the first wall 102-1, and magnets (not shown). The repeller 130 is configured so that the secondary electrons 120-2 from the front surface 112-1 of the cathode 112 travel repeatedly in helical paths, and then collides with the molecules of the at least one chemical 105. Repeller 130 serves to confine electrons inside chamber 102 and reflect them back toward electron source device 110.

Two magnets (not shown) may be optionally installed outside the ionization chamber 102 at the two ends, and aligned with repeller 130 and electron source device 110 in the same direction. Magnets create a magnetic field so that the electrons from electron source device 110 travel forward in a spiral direction toward repeller 130. Magnets, together with repeller 130 are configured so that the secondary electrons 120-2 from electron source device 110 travel repeatedly in helical paths, and efficiently collide with dopant molecules so as to generate the plasma comprising ionized chemicals. The dopant molecules are ionized to form plasma comprising dopant ions, radicals and other species. For example, $AsH_3$ molecules struck by electrons produce ions such as $As^+$, $As_2^+$ and $AsH_2^+$.

Referring to FIG. 2A, the front surface 112-1 of the cathode 112 is flat. The electrons 120-1 from the filament 114 and the secondary electrons 120-2 from the cathode 102 may travel forward in parallel direction toward. The resulting plasma in the forward direction may have much higher ionization degree than those at any other directions. As a result, the plasma inside the ionization chamber 102 may have a relatively limited uniformity.

Figure 3:
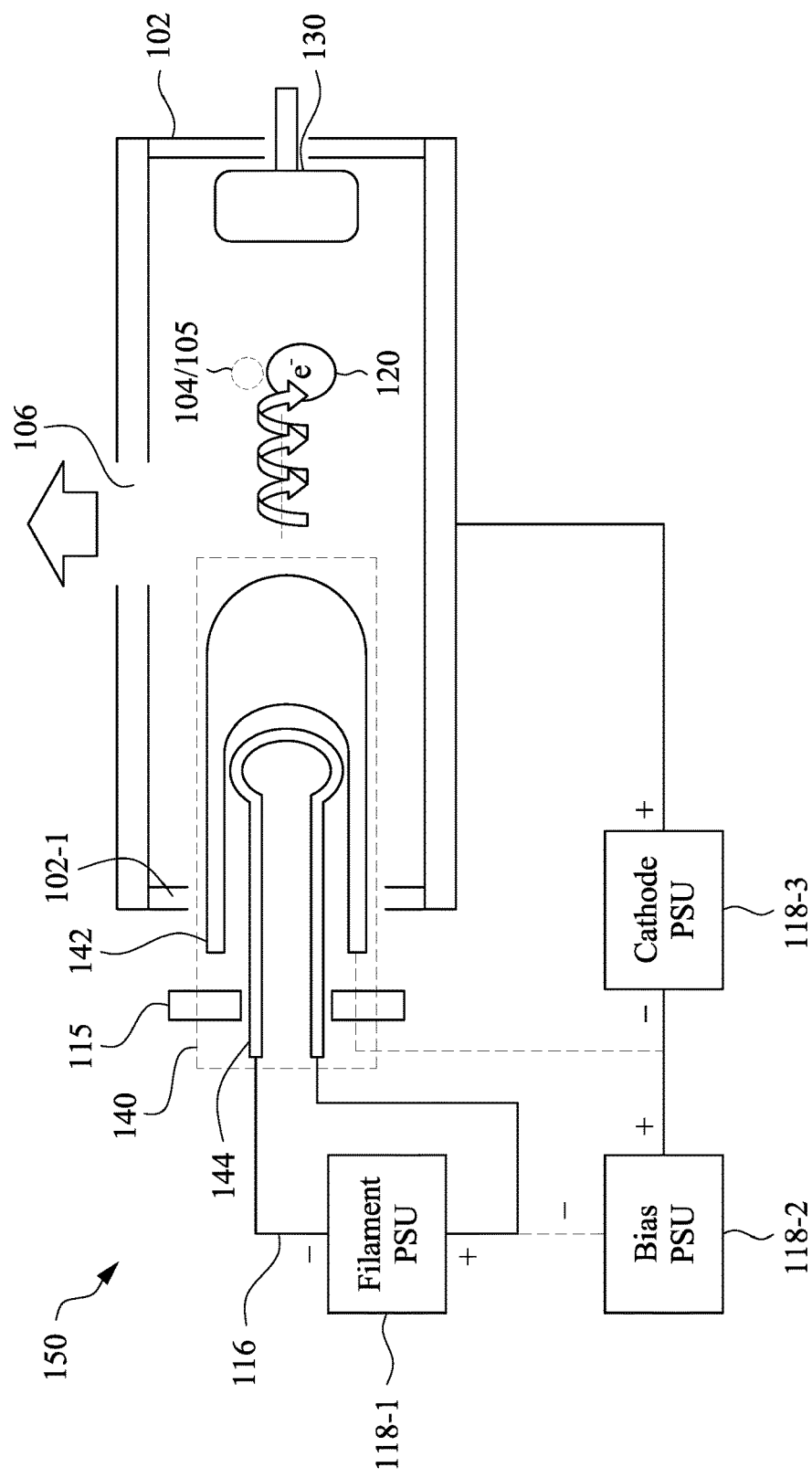
FIG. 3 is a cross-sectional view of an exemplary apparatus of ion beam source comprising a cathode having a surface curvature in accordance with some embodiments.
Figure 4A:
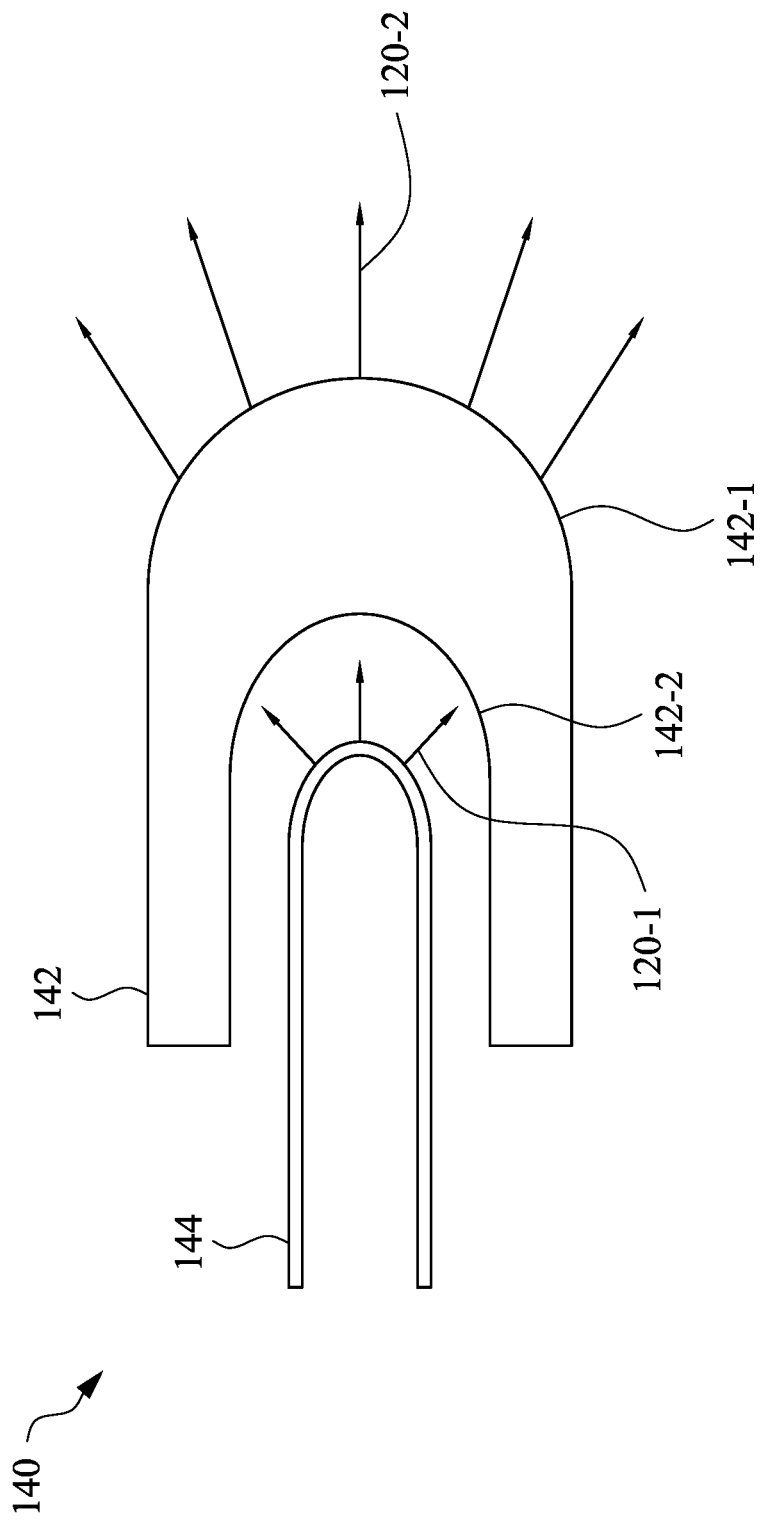
FIG. 4A is a magnified view illustrating the cathode of the exemplary apparatus of FIG. 3.
Figure 4B:
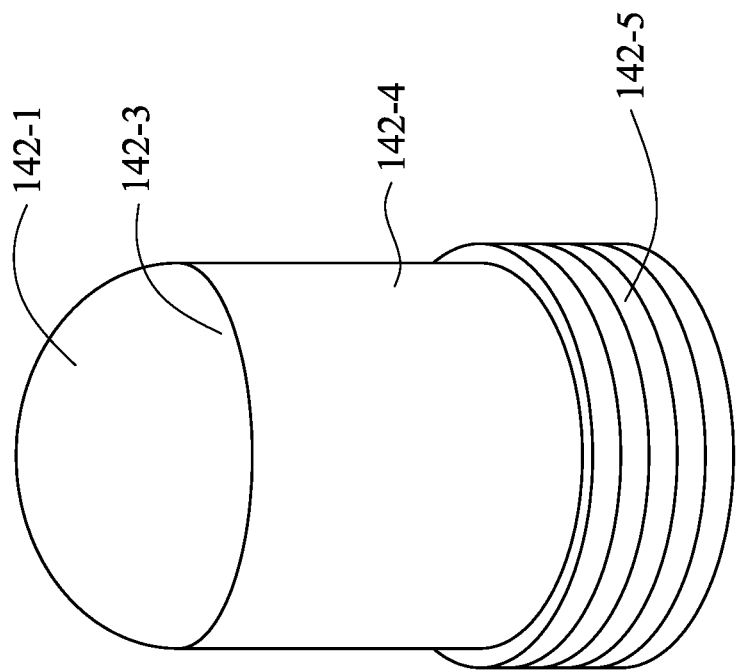
FIG. 4B is a perspective view illustrating the cathode of the exemplary apparatus of FIG. 3.
Figure 5:
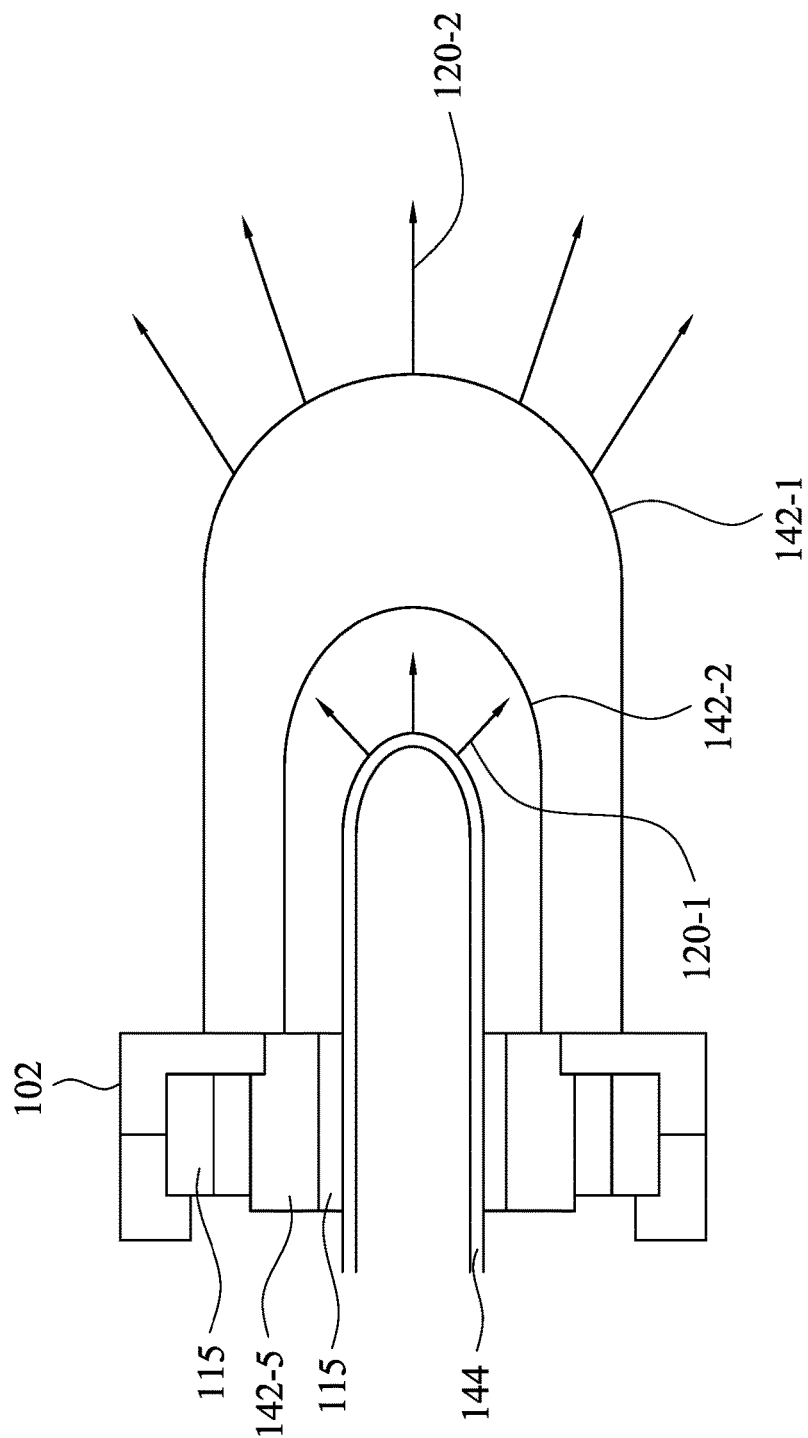
FIG. 5 a cross-sectional view illustrating a portion of the exemplary apparatus of FIG. 3.
Figure 6:
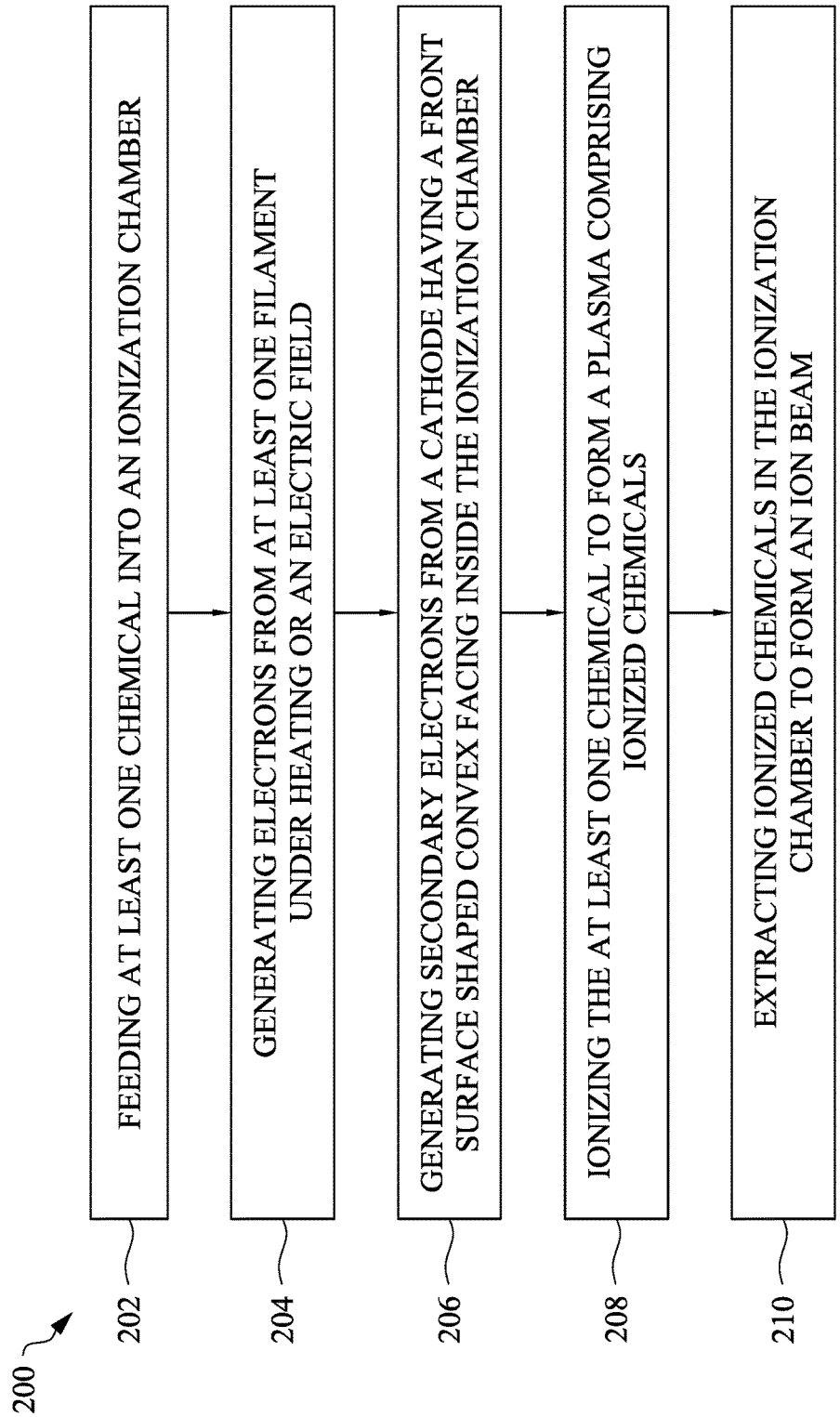
FIG. 6 is a flow chart illustrating an exemplary method for using the exemplary apparatus of FIG. 3 in accordance with some embodiments.

Referring to FIGS. 3-5, another exemplary apparatus 150 is provided in accordance with some embodiments. The exemplary apparatus 150 is the same as the exemplary apparatus 100 except the electronic source device 140, as compared to the electronic source device 110 as described above.

Referring to FIGS. 3 and 4A-4B, such an apparatus 150 comprises an ionization chamber 102 and an electron source device 140. The ionization chamber 102 is configured to receive at least one chemical and provide plasma comprising ionized chemicals, which include ions of the at least one chemical. The electron source device 140 is at least partially disposed inside the ionization chamber 102. The electron source device 140 comprises a cathode 142, and at least one filament 144 configured to generate electrons 120-1 under heating or an electric field. The filament 144 may be heated upon a voltage applied thereon. The cathode 142 has a front surface 142-1 and a back surface 142-2, and is configured to emit secondary electrons 120-2 from the front surface 142-1 when the electrons 120-1 from the at least one filament 144 hit or strike the back surface 142-2 of the cathode 142. The front surface 142-1 of the cathode 142 is not flat. For example, the front surface 142-1 of the cathode 142 is shaped convex facing inside the ionization chamber 102. The front surface 142-1 of the cathode 142 has a shape of a hemisphere. The back surface 142-2 of the cathode 142 may have a concave shape. In some embodiments, the cathode 142 is in a shape of a hollow cylinder with a hemisphere end, and the at least one filament 144 is disposed therein.

The cathode 142 is configured so that the secondary electrons 120-2 collide with the at least one chemical 105 so as to generate the plasma comprising ionized chemicals.

As described, the ionization chamber 102 includes at least one inlet 104 for receiving the at least one chemical 105 such as a dopant gas. The at least one inlet 104 may be one or more inlets for one or more corresponding chemicals. In some embodiments, the ionization chamber 102 defines an aperture 106 providing an exit pathway for the plasma comprising ionized chemicals.

In some embodiments, the front surface 142-1 of the cathode 142 may have any suitable shape such as a shape of a hemisphere. The back surface 142-2 of the cathode 142 may have a concave shape. The filament 144 may have a structure similar to filament 114 as shown in FIGS. 2C and 2D, except that the filament 144 may not be aligned on a same plane. In some embodiments, the filament 144 has a top portion with a tortuous path aligned in a convex surface facing the back surface 142-2 of the cathode 142. The overall shape and configuration of the filament 144 may correspond to the shape of the back surface 142-2 of the cathode 142. The filament 144 may not be in direct contact with the cathode 142.

Referring to FIG. 4B, in some embodiments, the cathode 142 is in a shape of a hollow cylinder with a hemisphere end, and the at least one filament 144 is disposed therein. Cathode 142 may include one piece or two pieces, for example, a unitary piece having the top portion 142-3 with the front surface 142-1, a middle portion 142-4, and a bottom portion having thread 142-5 (the same as thread 112-5 as described). Through the thread 142-5, the cathode 142 may be coupled or fixed onto a sidewall of the ionization chamber 102, or a fixture adjacent to the ionization chamber 102.

Referring to FIGS. 3 and 5, for example, the cathode 142 and the filament 144 may be coupled with the ionization chamber 102 through a fixture 115. In some embodiments, the electron source device 140 is disposed through or on a first wall 102-1 of the ionization chamber 102. The front surface 142-1 of the cathode 142 is disposed inside the ionization chamber 102. In some embodiments, the electron source device 140 is disposed on a sidewall of the ionization chamber.

The cathode 142 and the at least one filament 144 may be made of any suitable materials such as a refractory metal or alloy. Examples of suitable materials include, but are not limited to, niobium, molybdenum, tantalum, tungsten, rhenium, an alloy, and any combination thereof. For example, in some embodiments, either or both of the cathode 142 and the at least one filament 144 comprise tungsten. In some embodiments, both the at least one filament and the cathode are made of tungsten.

The apparatus 150 may further comprise a repeller 130 disposed on a second wall 102-2 opposite to the first wall 102-1, and magnets (not shown) as described above. The repeller 130 is configured so that the secondary electrons 120-2 from the front surface 142-2 of the cathode 142 travel repeatedly in helical paths, and then collides with the molecules of the at least one chemical 105.

The present disclosure also provides a method 200 of using the apparatus 150 as described for generating ions used in a process of ion implantation. Referring to FIG. 6, such a method 200 comprises steps 202-210. At step 202, at least one chemical is fed into an ionization chamber 102. At step 204, electrons 120-1 are generated from at least one filament 144 under heating or an electric field. The filament 114 may be heated upon a voltage applied thereon. At step 206, secondary electrons 120-2 are generated from the cathode 142 as described. The secondary electrons is emitted from the front surface when the electrons 120-2 from the at least one filament 144 hit the back surface of the cathode 142. The front surface 142-1 of the cathode 142 is shaped convex inside the ionization chamber 102. At step 208, the at least one chemical is ionized to form a plasma comprising ionized chemicals, which include ions of the at least one chemical.

In some embodiments, the method 200 further comprises step 210. At step 210, ionized chemicals in the ionization chamber 102 are exacted to form an ion beam. An ion extraction apparatus (not shown) having electrodes is used to extract the desired dopant ions based on electric charges. The dopant ions are further accelerated to form an ion beam. Such ion beam is used to dope a semiconductor wafer in the ion implantation system.

In some embodiments, the at least one chemical comprises a dopant gas. The plasma comprising ionized dopants is used for ion implantation in semiconductor processing. The ionization chamber 102 is used for providing ions during a process of ion implantation.

Figure 7:
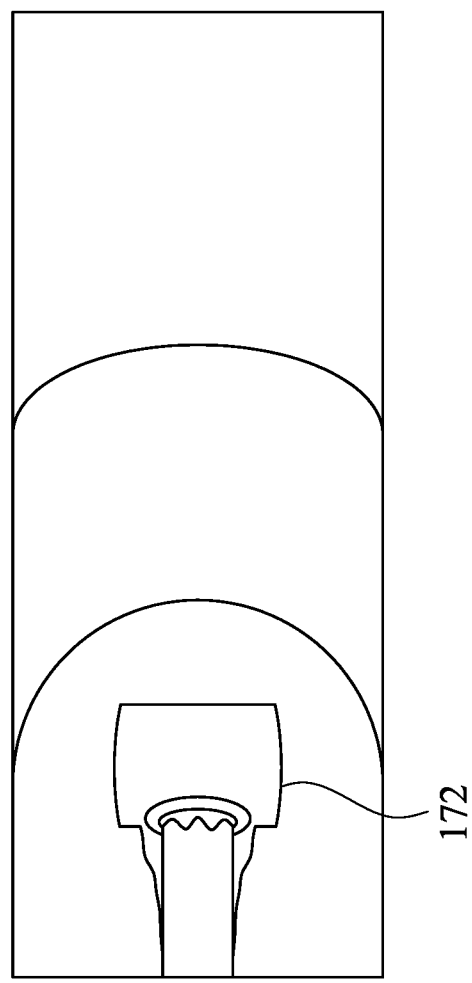
FIG. 7 is a cross sectional view illustrating the plasma distribution in the exemplary apparatus of FIG. 1 in some embodiments.
Figure 8:
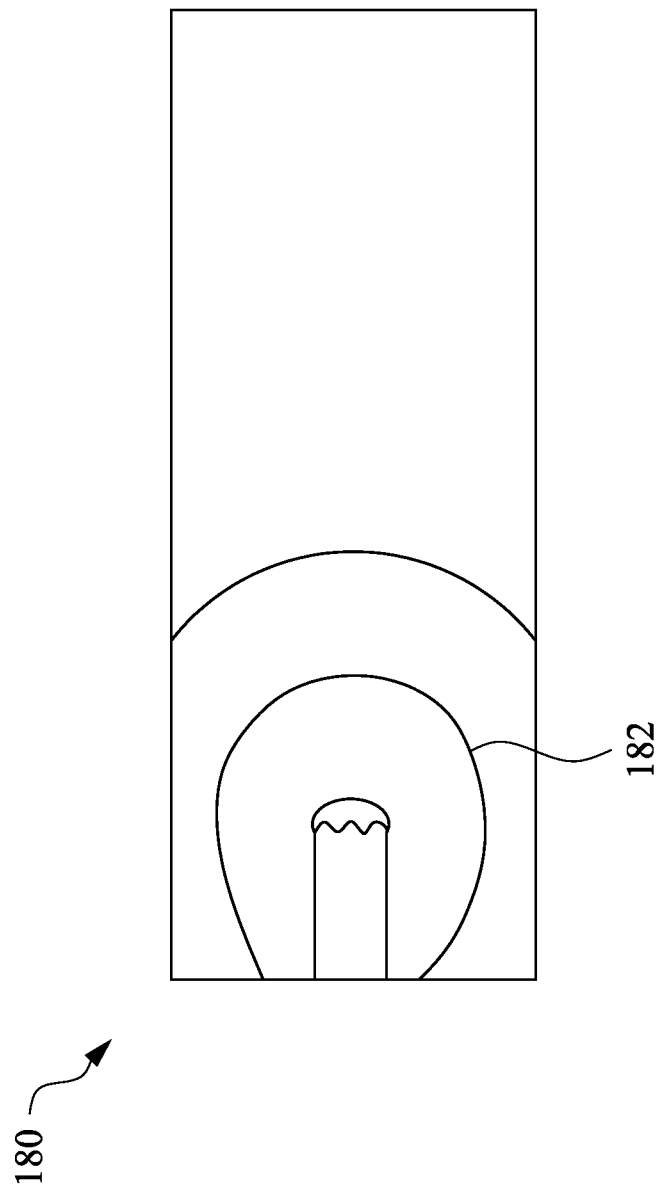
FIG. 8 is a cross sectional view illustrating the plasma distribution in the exemplary apparatus of FIG. 3 in some embodiments.

The apparatus 150 comprising the electron source device 140 provides improved uniformity and efficiency in plasma for a process of ion implantation, and thus an overall increase in productivity. Referring to FIG. 7, the apparatus 100 of FIG. 1 provides higher ionization degree in a horizontal direction than that in vertical direction (lines 172 in FIG. 7) because most of the secondary electrons 120-2 emit from the flat surface and travel horizontally (as shown in FIG. 2A. As a comparison, the apparatus 150 provides uniformly high ionization degree in all directions in inside the chamber 102 because the secondary electrons 120-2 emit from the front surface 142-2 having a curative, for example, a hemispherical surface (as illustrated in 4A).

In the apparatus 100 of FIG. 1, because the effective surface for heating is relatively small, emitting secondary electrons may not be so favorable. So extra work is needed for generating a desired ion beam based on Richardson's Law:

$$J = A_G T^2 e^{\frac{-W}{kT}}$$

where J is the emission current density, T is the temperature (K) of the metal, W is the work function of the metal, k is the Boltzmann constant, and $A_G$ is a parameter. However, extra work tends to damage a cathode. In the apparatus 150 of FIG. 3, because of uneven such as hemispherical surface, the heated surface for emitting secondary electrons is increased significantly (e.g., by >20%), the work needed for a same desired ion beam is reduced significantly (e.g., by at least 15%).

Figure 9:
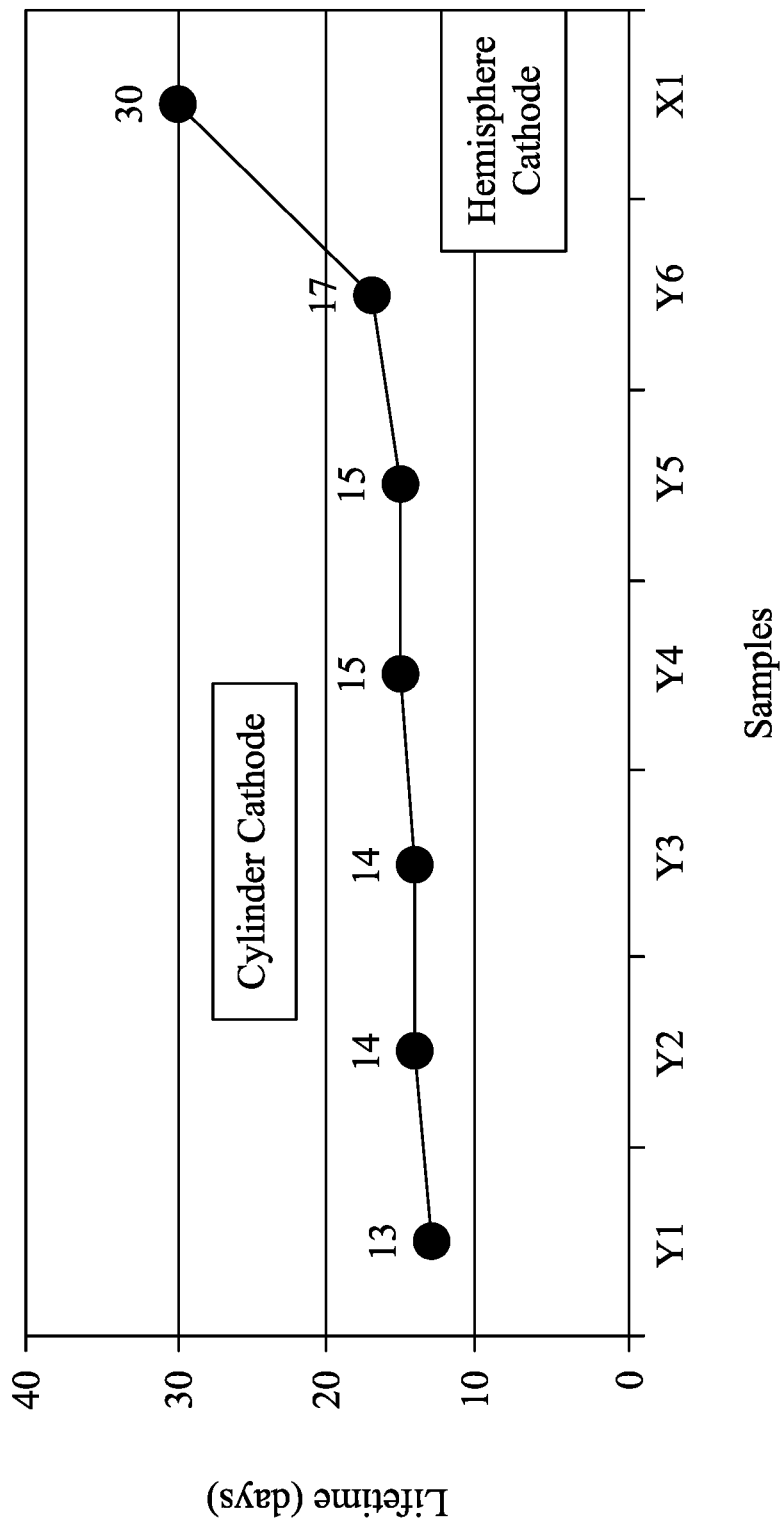
FIG. 9 shows the improvement in lifetime of the exemplary apparatus of FIG. 3 in accordance with some embodiments.

Because of uniform heating and improved efficiency, the apparatus 150 of FIG. 3 has much longer lifetime compared to apparatus 100 of FIG. 1. Referring to FIG. 9, the samples Y1-Y6, which are exemplary samples as shown in FIG. 1, have a lifetime of about 13-17 days. However, under the same using conditions, sample X1, which is an example as shown in FIG. 3, has a lifetime of about 30 days.

The present disclosure provides an apparatus of ion source for ion implantation. In accordance with some embodiments, such an apparatus comprises an ionization chamber and an electron source device. The ionization chamber is configured to receive at least one chemical and provide plasma comprising ionized chemicals. The electron source device is at least partially disposed inside the ionization chamber. The electron source device comprises at least one filament configured to generate electrons under heating or an electric field, and a cathode. The cathode has a front surface and a back surface, and is configured to emit secondary electrons from the front surface when the electrons from the at least one filament hit the back surface of the cathode. The front surface of the cathode is not flat. For example, the front surface of the cathode is shaped convex facing inside the ionization chamber. The cathode is configured so that the secondary electrons collide with the at least one chemical so as to generate the plasma comprising ionized chemicals.

In some embodiments, the ionization chamber includes at least one inlet for receiving the at least one chemical such as a dopant gas. The at least one inlet may be one or more inlets for one or more corresponding chemicals. In some embodiments, the ionization chamber defines an aperture providing an exit pathway for the plasma comprising ionized chemicals.

In some embodiments, the front surface of the cathode may have any suitable shape such as a shape of a hemisphere. The back surface of the cathode may have a concave shape. In some embodiments, the filament has a top portion with a tortuous path aligned in a convex surface facing the back surface of the cathode. The overall shape and configuration of the filament may correspond to the shape of the back surface of the cathode. The filament may not be in direct contact with the cathode. In some embodiments, the cathode is in a shape of a hollow cylinder with a hemisphere end, and the at least one filament is disposed therein.

The at least one filament and the cathode may be made of any suitable materials such as a refractory metal or alloy. Examples of suitable materials include, but are not limited to niobium, molybdenum, tantalum, tungsten, rhenium, an alloy, and any combination thereof. For example, in some embodiments, either or both of the at least one filament and the cathode comprise tungsten.

In some embodiments, the electron source device is disposed through or on a first wall of the ionization chamber. The front surface of the cathode is disposed inside the ionization chamber. The apparatus may further comprise a repeller disposed on a second wall opposite to the first wall, and magnets. The repeller is configured so that the secondary electrons from the front surface of the cathode travel repeatedly in helical paths, and then collides with the molecules of the at least one chemical.

In some embodiments, an apparatus comprises an ionization chamber and an electron source device. The ionization chamber comprises at least one inlet configured to receive at least one chemical. The ionization chamber also defines an aperture configured to provide plasma comprising ionized chemicals. The electron source device is at least partially disposed inside the ionization chamber. The electron source device comprises at least one filament and a cathode. The at least one filament is configured to generate electrons under heating. The cathode has a front surface and a back surface, and is configured to emit secondary electrons from the front surface when the electrons from the at least one filament hit the back surface of the cathode. The front surface of the cathode is shaped convex facing inside the ionization chamber. For example, the front surface of the cathode has a shape of a hemisphere. The back surface of the cathode may have a concave shape. In some embodiments, the cathode is in a shape of a hollow cylinder with a hemisphere end, and the at least one filament is disposed therein. In some embodiments, the at least one filament and the cathode are made of tungsten. The electron source device is disposed on a sidewall of the ionization chamber.

In another aspect, the present disclosure provides a method for generating ions used in a process of ion implantation. Such a method comprises steps of feeding at least one chemical into an ionization chamber, generating electrons from at least one filament under heating or an electric field, and generating secondary electrons from a cathode. The cathode has a front surface and a back surface. The secondary electrons is emitted from the front surface when the electrons from the at least one filament hit the back surface of the cathode. The front surface of the cathode is shaped convex inside the ionization chamber. Such a method further comprises ionizing the at least one chemical to form a plasma comprising ionized chemicals.

In some embodiments, the method further comprises extracting ionized chemicals in the ionization chamber to form an ion beam. In some embodiments, the at least one chemical comprises a dopant gas. The plasma comprising ionized dopants is used for ion implantation in semiconductor processing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
    an ionization chamber configured to receive at least one chemical and provide a plasma comprising ions of the at least one chemical; and
    an electron source device at least partially disposed inside the ionization chamber, the electron source device comprising
        at least one filament configured to generate electrons, and a cathode having a front surface and a back surface, and configured to emit secondary electrons from the front surface when the electrons from the at least one filament hit the back surface of the cathode, wherein the front surface of the cathode is shaped convex facing inside the ionization chamber, and the back surface of the cathode has a portion opposite the front surface and in a concave shape.

2. The apparatus of claim 1, wherein the ionization chamber includes at least one inlet for receiving the at least one chemical.

3. The apparatus of claim 1, wherein the cathode is configured so that the secondary electrons collide with the at least one chemical so as to generate the plasma comprising ions of the at least one chemical.

4. The apparatus of claim 1, wherein the ionization chamber defines an aperture providing an exit pathway for the plasma.

5. The apparatus of claim 1, wherein the front surface of the cathode has a shape of a hemisphere.

6. The apparatus of claim 1, wherein the filament has a top portion with a tortuous path aligned in a convex surface facing the back surface of the cathode.

7. The apparatus of claim 1, wherein the at least one filament and the cathode comprise tungsten.

8. The apparatus of claim 1, wherein the cathode is in a shape of a hollow cylinder with a hemisphere end, and the at least one filament is disposed therein.

9. The apparatus of claim 1, wherein the electron source device is disposed through a first wall of the ionization chamber, and the front surface of the cathode is disposed inside the ionization chamber.

10. The apparatus of claim 9, further comprising a repeller disposed on a second wall opposite to the first wall, the repeller configured so that the secondary electrons from the front surface of the cathode travel repeatedly in helical paths.

11. The apparatus of claim 1, wherein the at least one filament and the cathode are made of a material selected from the group consisting of niobium, molybdenum, tantalum, tungsten, rhenium, an alloy, and any combination thereof.

12. An apparatus, comprising:
an ionization chamber comprising at least one inlet configured to receive at least one chemical, the ionization chamber defining an aperture configured to provide a plasma comprising ions of the at least one chemical; and
an electron source device at least partially disposed inside the ionization chamber, the electron source device comprising at least one filament configured to generate electrons under heating, and a cathode having a front surface and a back surface, and configured to emit secondary electrons from the front surface when the electrons from the at least one filament hit the back surface of the cathode, wherein the front surface of the cathode is shaped convex facing inside the ionization chamber, the back surface of the cathode has a portion opposite the front surface and in a concave shape, and the filament has a top portion with a tortuous path aligned in a convex surface.

13. The apparatus of claim 12, wherein the front surface of the cathode has a shape of a hemisphere.

14. The apparatus of claim 12, wherein the cathode is in a shape of a hollow cylinder with a hemisphere end, and the at least one filament is disposed therein.

15. The apparatus of claim 12, wherein the at least one filament and the cathode are made of tungsten.

16. The apparatus of claim 12, wherein the electron source device is disposed on a sidewall of the ionization chamber.

17. A method for generating ions used in a process of ion implantation, comprising:

feeding at least one chemical into an ionization chamber;

generating electrons from at least one filament under heating;

generating secondary electrons from a cathode, the cathode having a front surface and a back surface, wherein the secondary electrons is emitted from the front surface when the electrons from the at least one filament hit the back surface of the cathode, and wherein the front surface of the cathode is shaped convex inside the ionization chamber, and the back surface of the cathode has a portion opposite the front surface and in a concave shape; and ionizing the at least one chemical to form a plasma comprising ions of the at least one chemical.

18. The method of claim 17, further comprising extracting ions of the at least one chemical in the ionization chamber to form an ion beam.

19. The method of claim 17, wherein the at least one chemical comprises a dopant gas.

20. The apparatus of claim 12, wherein the at least one filament and the cathode are made of a material selected from the group consisting of niobium, molybdenum, tantalum, tungsten, rhenium, an alloy, and any combination thereof.

* * * * *